(12) United States Patent
Hiwada

(10) Patent No.: US 7,928,323 B2
(45) Date of Patent: Apr. 19, 2011

(54) WIRING UNIT, METHOD FOR PRODUCING WIRING UNIT, LIQUID JETTING APPARATUS, AND METHOD FOR PRODUCING LIQUID JETTING APPARATUS

(75) Inventor: Shuhei Hiwada, Toyoake (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 451 days.

(21) Appl. No.: 12/218,795

(22) Filed: Jul. 17, 2008

(65) Prior Publication Data

US 2009/0020327 A1 Jan. 22, 2009

(30) Foreign Application Priority Data

Jul. 18, 2007 (JP) ................................. 2007-187659
Jul. 19, 2007 (JP) ................................. 2007-188672

(51) Int. Cl.
  *H05K 1/11* (2006.01)
(52) U.S. Cl. ........ 174/264; 174/262; 174/261; 174/259; 174/256
(58) Field of Classification Search .......... 174/260–266, 174/259, 254; 347/68, 69, 70–72; 310/311, 310/317, 318, 321; 367/70, 68; 29/874
See application file for complete search history.

(56) References Cited

U.S. PATENT DOCUMENTS

| | | | |
|---|---|---|---|
| 5,610,371 A | 3/1997 | Hashimoto et al. | |
| 5,746,927 A | 5/1998 | Hashimoto et al. | |
| 7,055,936 B2 | 6/2006 | Imai et al. | |
| 7,370,943 B2 | 5/2008 | Imai et al. | |
| 2002/0066595 A1* | 6/2002 | Ohta et al. | 174/265 |
| 2005/0155792 A1* | 7/2005 | Ito et al. | 174/264 |
| 2007/0074902 A1* | 4/2007 | Hirata | 174/262 |
| 2007/0235218 A1* | 10/2007 | Miyamoto et al. | 174/261 |
| 2009/0016671 A1* | 1/2009 | Asai et al. | 385/14 |

FOREIGN PATENT DOCUMENTS

JP 2004-114609 4/2004

* cited by examiner

*Primary Examiner* — Dameon E Levi
*Assistant Examiner* — Hoa C Nguyen
(74) *Attorney, Agent, or Firm* — Frommer Lawrence & Haug LLP

(57) ABSTRACT

A wiring unit includes a first insulating layer which is provided with an electrode and a wire electrically connected to the electrode on one surface of the first insulating layer; a second insulating layer which is formed on the one surface of the first insulating layer and which covers the wire; an adhesive layer which is formed on a surface, of the second insulating layer, not facing the first insulating layer; a through hole which is formed through the adhesive layer and the second insulating layer and in which the electrode is exposed; a protective sheet which is detachably adhered on a surface, of the adhesive layer, not facing the second insulating layer, and; a liquid electroconductive material which is filled in a space defined by the through hole, the electrode exposed in the through hole, and the protective sheet.

15 Claims, 8 Drawing Sheets

FIRST STEP

SECOND STEP

THIRD STEP

FOURTH STEP

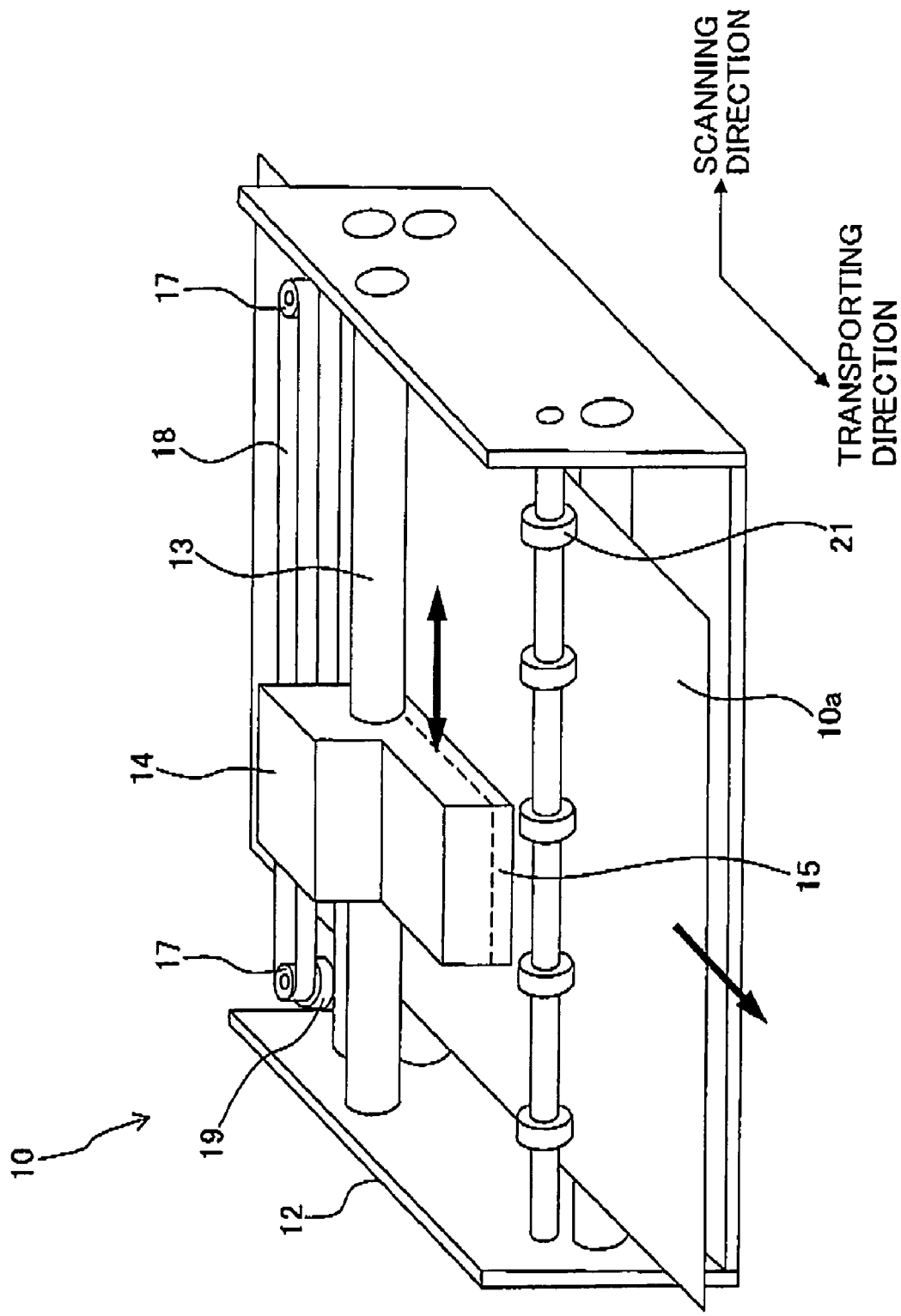

FIRST STEP

SECOND STEP

THIRD STEP

FOURTH STEP

WIRING UNIT, METHOD FOR PRODUCING WIRING UNIT, LIQUID JETTING APPARATUS, AND METHOD FOR PRODUCING LIQUID JETTING APPARATUS

CROSS REFERENCE TO RELATED APPLICATION

The present application claims priority from Japanese Patent Application No. 2007-187659, filed on Jul. 18, 2007 and Japanese Patent Application No. 2007-188672, filed on Jul. 19, 2007, the disclosure of each of which is incorporated herein by reference in its entirety.

BACKGROUND OF THE INVENTION

1. Field of the Invention

The present invention relates to a wiring unit having a first insulating layer provided with a power feeding electrode and a wire electrically connected to the power feeding electrode, on one surface thereof, and particularly to a wiring unit which is capable of connecting electrically the power feeding electrode and an object such as another electrode by a liquid electroconductive material, moreover, the present invention relates to a method for producing such wiring unit, a liquid jetting apparatus which is formed by using the wiring unit, and a method for producing the liquid jetting apparatus in which such wiring unit is used.

2. Description of the Related Art

An ink-jet printer, which has a channel unit provided with a liquid channel and which jets an ink from a jetting port formed at a downstream of the liquid channel onto a recording medium, has hitherto been known as an example of a liquid jetting apparatus. More elaborately, a pressure chamber having a predetermined volume is formed in the liquid channel, to have an opening partially, and a piezoelectric layer is provided such that the opening of the pressure chamber is covered. The piezoelectric layer is deformed by applying a voltage, and is sandwiched between a common electrode which is kept at a predetermined electric potential and a drive electrode to which a predetermined electric potential different from the electric potential of the common electrode is imparted by applying a voltage. Furthermore, in a connecting structure of a flexible circuit board disclosed in U.S. Pat. Nos. 7,055,936 and 7,370,943 (correspond to Japanese Patent Application Laid-open No. 2004-114609), a power feeding electrode for imparting a predetermined electric potential to a drive electrode is arranged in the vicinity of the drive electrode, and the drive electrode and the power feeding electrode are connected electrically by solder.

When an electric power is supplied to the power feeding electrode from an external power source, a voltage is applied to the drive electrode which is connected to the power feeding electrode, and there is a potential difference developed between drive electrode and the common electrode which is kept at the predetermined voltage. As a result, the piezoelectric layer is deformed, and a volume of the pressure chamber is also changed. Due to the change in the volume of the pressure chamber, a liquid inside the pressure chamber is pressurized and jetted to an outside from the jetting port via the liquid channel.

In general, solder has a poor flexibility when dried. Therefore, in a liquid jetting apparatus such as the one mentioned above, if an electrical contact between the drive electrode and solder is provided in an area corresponding to the pressure chamber when viewed from a direction of the thickness of the piezoelectric layer, when the voltage is applied, a deformation of a portion of the piezoelectric layer corresponding to the pressure chamber is hindered, and it is difficult to pressurize sufficiently the liquid inside the pressure chamber. Moreover, in order to secure the electrical contact between the drive electrode and the solder without hindering the deformation of the piezoelectric layer, it is necessary to extend a wire from the drive electrode up to an outside of the area corresponding to the pressure chamber, and to connect the wire and the solder. In other words, since it is necessary to extend a wire for electrical connection for each pressure chamber, in a case of an ink-jet printer which includes a plurality of pressure chambers, it becomes difficult to have a high integration of the pressure chambers. As a result, it becomes difficult to realize further compactness of the channel unit and further improvement in a resolution of a printed matter such as a photograph.

SUMMARY OF THE INVENTION

In view of this, an object of the present invention is to provide a wiring unit, in which the piezoelectric layer can be deformed appropriately and which realizes a small size of the channel unit and an improvement in a resolution of an image formed by a jetted liquid jetted, as a component of a liquid jetting apparatus. More concretely, an object of the present invention is to provide a wiring unit, in which a liquid electroconductive material to electrically connect the power feeding electrode and an object is filled, and which is possible to connect easily the power feeding electrode and the object via the liquid electroconductive material by being stuck on the object. Moreover, another object of the present invention is to provide a method for producing such wiring unit, a liquid jetting apparatus in which such wiring unit is used, and a method for producing the liquid jetting apparatus in which such wiring unit is used.

According to a first aspect of the present invention, there is provided a wiring unit including, a first insulating layer which is provided with an electrode and a wire electrically connected to the electrode on one surface of the first insulating layer; a second insulating layer which is formed on the one surface of the first insulating layer and which covers the wire; an adhesive layer which is formed on a surface, of the second insulating layer, not facing the first insulating layer; a through hole which is formed through the adhesive layer and the second insulating layer and in which the electrode is exposed; a protective sheet which is detachably adhered on a surface, of the adhesive layer, not facing the second insulating layer, to cover the through hole; and a liquid electroconductive material which is filled in a space defined by the through hole, the electrode exposed in the through hole, and the protective sheet.

According to the first aspect of the present invention, it is possible to connect electrically the electrode and an object easily by the liquid electroconductive material by peeling the protective sheet off from the adhesive layer, and attaching it to the object. Moreover, since the electrode and the object are connected via the liquid electroconductive material, it is possible to secure an electrical conduction even when the object is deformed. For instance, when the wiring unit is used for imparting an electric potential to the piezoelectric layer of the liquid jetting apparatus, since it is possible to connect the piezoelectric layer and the electrode by making the liquid electroconductive material in a direct contact with a portion of the piezoelectric layer corresponding to the pressure chamber, a high integration of the pressure chambers is facilitated without hindering the deformation of the portion of the piezoelectric layer corresponding to the pressure chamber. Therefore, it is also possible to facilitate a small size of the channel unit in which a plurality of pressure chambers is formed, and a high resolution of an image formed by the liquid jetted. Besides, since the liquid electroconductive material is filled in the wiring unit, it is possible to provide the wiring unit as a commercial product.

In the wiring unit according to the present invention, the space may have a first space in which the liquid electroconductive material is accommodated and a second space in which the liquid electroconductive material is not accommodated. In this case, when an electric power is supplied from the electrode to an object via the liquid electroconductive material, even when the liquid electroconductive material expands due to heat, it is possible to accommodate an amount of volume increased due to the expansion, in the second space.

In the wiring unit according to the present invention, the second insulating layer and the adhesive layer are formed integrally by an insulating sheet having an adhesive surface.

In the wiring unit according to the present invention, a portion of the electrode may be exposed in the through hole.

In the wiring unit according to the present invention, the first insulating layer may be formed of polyimide, and the second insulating layer may be formed of solder resist. Moreover, conversely, the first insulating layer may be formed of solder resist, and the second insulating layer may be formed of polyimide.

According to a second aspect of the present invention, there is provided a method for producing a wiring unit, including forming a stacked body which has a first insulating layer having an electrode and a wire electrically connected to the electrode on one surface of the first insulating layer, a second insulating layer stacked on the one surface of the first insulating layer, an adhesive layer formed on a surface, of the second insulating layer, not facing the first insulating layer, a through hole formed through the adhesive layer and the second insulating layer and in which the electrode is exposed; injecting a liquid electroconductive material into a recess defined by the through hole and the electrode exposed in the through hole: and attaching a detachable protective sheet on the adhesive layer so that the protective sheet covers the through hole to enclose the liquid electroconductive material in the wiring unit.

According to the second aspect of the present invention, it is possible to manufacture easily the wiring unit in which the liquid electroconductive material is filled, and it is possible to peel the protective sheet off at the time of using, and attach it easily to a target.

In the method for producing the wiring unit of the present invention, a space defined by the recess and the protective sheet may have a first space in which the liquid electroconductive material is accommodated and a second space in which the liquid electroconductive material is not accommodated. In this case, when an electric power is supplied from the electrode to an object via the liquid electroconductive material, even when the liquid electroconductive material expands due to heat, it is possible to accommodate an amount of volume increased due to the expansion, in the second space.

According to a third aspect of the present invention, there is provided a liquid jetting apparatus including: a jetting port through which a liquid is jetted; a liquid channel which is connected to the jetting port, and through which the liquid to be jetted from the jetting port flows; a pressure chamber which is formed in the liquid channel; a piezoelectric layer which covers the pressure chamber and which is deformed to change a volume of the pressure chamber when a voltage is applied to the piezoelectric layer; and a wiring unit having an electrode which is electrically connected to the piezoelectric layer and which applies the voltage, wherein the wiring unit includes a first insulating layer provided with an electrode and a wire electrically connected to the electrode on one surface of the first insulating layer, a second insulating layer which is formed on the one surface of the first insulating layer and which covers the wire, an adhesive layer which is formed on a surface of the second insulating layer not facing the first insulating layer, a through hole which is formed through the adhesive layer and the second insulating layer and in which the electrode is exposed; a liquid electroconductive material is accommodated in a recess which is defined by the through hole and the electrode exposed in the through hole; and the wiring unit is connected via the adhesive layer to a surface of the piezoelectric layer not facing the pressure chamber, and the electrode and the piezoelectric layer are electrically connected to each other via the liquid electroconductive material.

According to the third aspect of the present invention, the piezoelectric layer and the electrode in the wiring unit are electrically connected via the liquid electroconductive material. Therefore, a high integration of the pressure chambers is facilitated without hindering the deformation of the portion of the piezoelectric layer corresponding to the pressure chamber. Therefore, it is also possible to facilitate making small the channel unit in which, a plurality of pressure chambers is formed, and have a high resolution of an image formed by the liquid jetted.

In the liquid jetting apparatus of the present invention, a drive electrode may be formed on the surface of the piezoelectric layer not facing the pressure chamber, at a position corresponding to the pressure chamber; and the electrode of the wiring unit may be electrically connected to the surface of the piezoelectric layer, not facing the pressure chamber, via the liquid electroconductive material and the drive electrode. In this case, it is possible to connect the liquid electroconductive material and the piezoelectric layer in a low resistance. The piezoelectric layer formed by a method such as an aerosol deposition method (AD method) has a rough surface. Therefore when the piezoelectric layer and the liquid electroconductive material are made in a direct contact, depending on a viscosity of the liquid electroconductive material (in other words, when the viscosity is comparatively higher), it is not possible to secure a sufficient contact area, and there is a possibility that a resistance at the contact point becomes high. Whereas, when the piezoelectric layer and the liquid electroconductive material are connected via a drive electrode which is provided separately on a surface of the piezoelectric layer, by using a material having a comparatively smooth surface, it is possible to secure substantially a contact area between the drive electrode and the liquid electroconductive material, and as a result, it is possible to connect the piezoelectric layer and the liquid electroconductive material in a low resistance. As the drive electrode, it is possible to use an electrode which is formed on the surface of the piezoelectric layer by a hitherto known method of screen printing an electroconductive paste (such as silver-palladium paste), and then drying the electroconductive paste which is screen printed. The drive electrode formed in such manner is in a sufficiently close contact with the piezoelectric layer, and has a comparatively smooth outer surface.

In the liquid jetting apparatus according to the present invention, the drive electrode may be formed in an area, of the piezoelectric layer, corresponding to the pressure chamber.

In the liquid jetting apparatus according to the present invention, a space defined by the recess and the surface of the piezoelectric layer not facing the pressure chamber may have a first space in which the liquid electroconductive material is accommodated and a second space in which the liquid electroconductive material is not accommodated.

In the liquid jetting apparatus according to the present invention, an area at which the piezoelectric layer and the electroconductive material make contact with each other may be included in an area of the piezoelectric layer corresponding to the pressure chamber. In this case, since the electrode of the wiring unit and the area of the piezoelectric layer corresponding to the pressure chamber are electrically connected with each other via the liquid electroconductive material, it is possible to facilitate a high integration of the pressure chambers without hindering the deformation of the piezoelectric layer corresponding to the pressure chamber.

According to a fourth aspect of the present invention, there is provided a method for producing a liquid jetting apparatus having a jetting port which jets a liquid, a liquid channel which is connected to the jetting port and through which the liquid to be jetted from the jetting port flows, and a pressure chamber which is formed in the liquid channel, the method including: providing a piezoelectric layer, which is deformed when a voltage is applied to the piezoelectric layer, such that one surface of the piezoelectric layer faces the pressure chamber; providing a wiring unit including a first insulating layer which is provided with an electrode and a wire electrically connected to the electrode on one surface of the first insulating layer, a second insulating layer which is formed on the one surface of the first insulating layer and which covers the wire, an adhesive layer which is formed on a surface of the second insulating layer not facing the first insulating layer, a through hole which is formed through the adhesive layer and the second insulating layer and in which the electrode is exposed, and a protective sheet which is detachably adhered on a surface of the adhesive layer not facing the second insulating layer, a liquid electroconductive material being filled in a space defined by the through hole, and the electrode being exposed in the through hole, and the protective sheet; peeling the protective sheet off from the wiring unit; and attaching the channel unit, from which the protective sheet has been peeled off, to the other surface of the piezoelectric layer via the adhesive layer such that an area of the piezoelectric layer corresponding to the pressure chamber and the through hole of the wiring unit are overlapped with each other in a thickness direction of the piezoelectric layer to electrically connect the electrode and the piezoelectric layer via the liquid electroconductive material.

According to the fourth aspect of the present invention, since it is possible to connect easily the piezoelectric layer and the electrode provided to the channel unit, it is possible to simplify a producing process, and to facilitate a reduction in a producing cost.

The method for producing the liquid jetting apparatus according to the present invention may further include forming a drive electrode on the other surface of the piezoelectric layer at a position corresponding to the pressure chamber.

BRIEF DESCRIPTION OF THE DRAWINGS

FIG. 3 is a schematic perspective view showing a structure of a liquid jetting apparatus according to the embodiment of the present invention;

DETAILED DESCRIPTION OF THE PREFERRED EMBODIMENTS

A wiring unit, a method for producing the wiring unit, a liquid jetting apparatus and a method for producing the liquid jetting apparatus according to an embodiment of the present invention will be described below concretely while referring to the accompanying diagrams.

Figure 1:
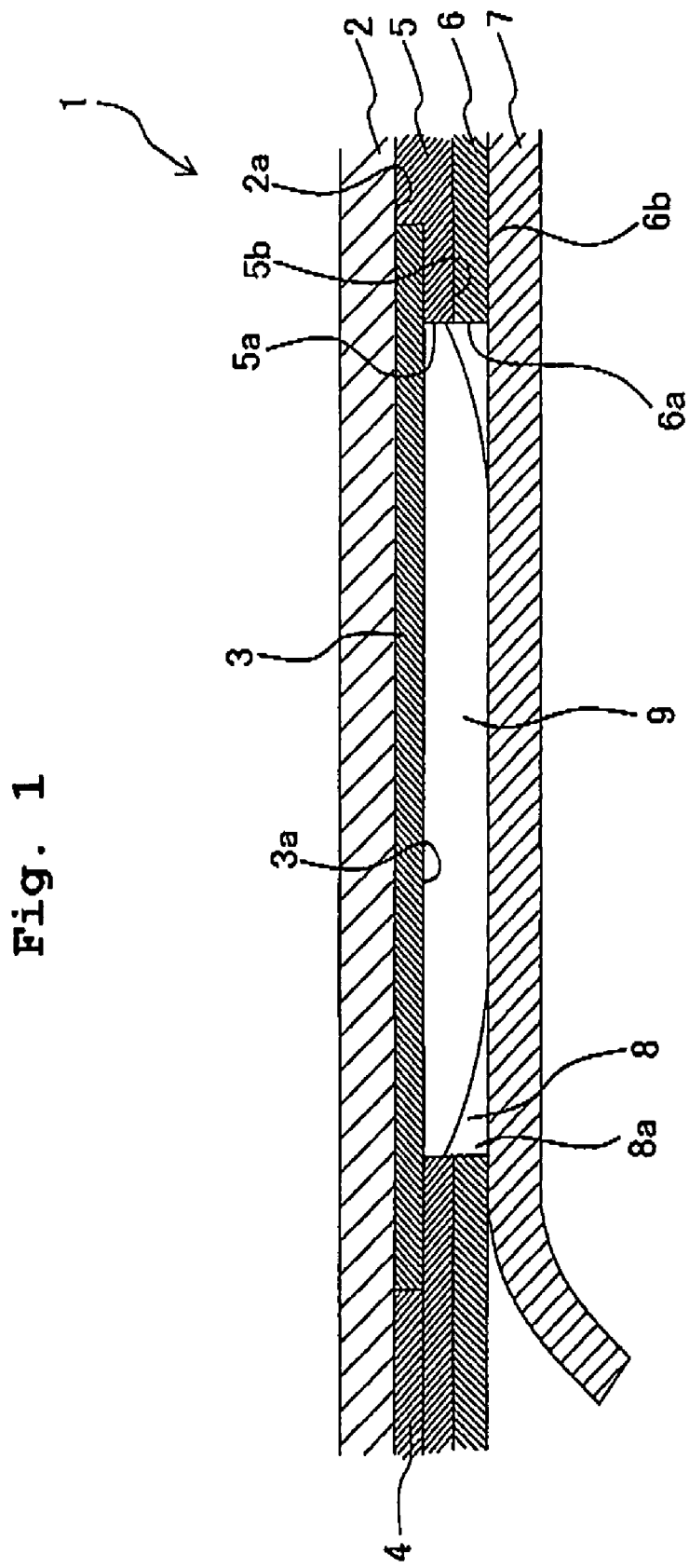
FIG. 1 is a cross-sectional view showing a structure of a wiring unit according to an embodiment of the present invention.

Firstly, the wiring unit will be described below. FIG. 1 is a cross-sectional view showing a structure of the wiring unit according to the embodiment of the present invention. A wiring unit 1 shown in FIG. 1 includes a substrate (first insulating layer) 2 in the form of a plate (or a sheet form), made of an insulating material such as polyimide, and a wire 4 and a power feeding electrode (an electrode) 3 formed of a copper foil arranged on one surface (lower surface in FIG. 1) 2a of the substrate 2. The wire 4 electrically connects the power feeding electrodes 3 and an outside power supply which is not shown in the diagram, and an electric power is supplied to the power feeding electrode 3 from the outside power supply.

Moreover, an insulating layer (a second insulating layer) 5 made of an insulating material such as solder resist, and having a through hole 5a is provided on the one surface 2a of the substrate 2. The wire 4 provided on the one surface 2a of the substrate 2 is covered by the insulating layer 5, and the power feeding electrode 3 is exposed in the through hole 5a. A part of the power feeding electrode 3 in FIG. 1 is covered by the insulating layer 5, and a portion 3a of the power feeding electrode 3 is exposed in the through hole 5a. However, the entire of the power feeding electrode 3 may be exposed in the through hole 5a.

An adhesive layer 6 is provided on a surface 5b, of the insulating layer 5, not facing the substrate 2. It is possible to use a double-adhesive film etc. as the adhesive layer 6. The adhesive layer 6 has a through hole 6a, a shape of which matches with a shape of the through hole 5a formed in the insulating layer 5, and the adhesive layer 6 is adhered to the insulating layer 5 such that the power feeding electrode 3 is partially exposed through the through holes 5a and 6a. The insulating layer 5 and the adhesive layer 6 may be formed integrally by an insulating sheet having adhesiveness on a surface. Further, a protective sheet 7 which is detachable is adhered to the adhesive layer 6, on a surface 6b not facing the insulating layer 5 so that the protective sheet 7 covers the through holes 5a and 6a. As the protective sheet, for example, polyethylene terephthalate is usable and it is desirable that the thickness of the protective sheet is about 10 μm to 1 mm. A first accommodating space 8 which is a liquid-tight space is defined by the through holes 5a and 6a, the power feeding electrode 3 partially exposed in the through holes, and the protective sheet 7, and a liquid electroconductive material 9 is filled in the first accommodating space 8. Moreover, the first accommodating space 8 has a surplus volume in addition to a volume (first space) occupied by the liquid electroconductive material 9, and this surplus volume forms a first surplus space (second space) 8a.

Next, a method for producing the wiring unit will be described below. FIG. 2A to FIG. 2D are diagrams for describing a method for producing the wiring unit 1 shown in FIG. 1, and show steps from a first step to a fourth step respectively. The wiring unit 1 in FIG. 2 shows the wiring unit 1 shown in FIG. 1 turned up side down, Firstly, in the first step shown in FIG. 2A, the wire 4 and the power feeding electrode 3 connected electrically with each other are arranged on the one surface 2a of the substrate 2. In the second step, the insulating layer 5 and the adhesive layer 6 are arranged in order on the one surface 2a of the substrate 2, and joined, such that, the power feeding electrode 3 is exposed through the through holes 5a and 6a (refer to FIG. 2B). Accordingly, a stacked body in which the substrate (first insulating layer) 2, the power feeding electrode 3 and the wire 4, the insulating layer (second insulating layer) 5, and the adhesive layer 6 are arranged in the abovementioned order is formed, and the power feeding electrode 3 is exposed in the through holes 5a and 6a formed in the insulating layer 5 and the adhesive layer 6, respectively.

It is possible to form the insulating layer 5 by a method such as a photolithography and a screen printing. In the photolithography, a surface of the insulating layer 5 on which a photosensitive substance applied is partially masked, and it is possible to form the through hole 5a of the abovementioned shape by exposure. Moreover, in a case of forming the minute through hole 5a, it is preferable to use the photolithography than using the screen printing.

Figure 2A:
FIG. 2A to FIG. 2D are diagrams for describing a producing method of the wiring unit shown in FIG. 1, and show steps from a first step to a fourth step respectively.
Figure 2B:
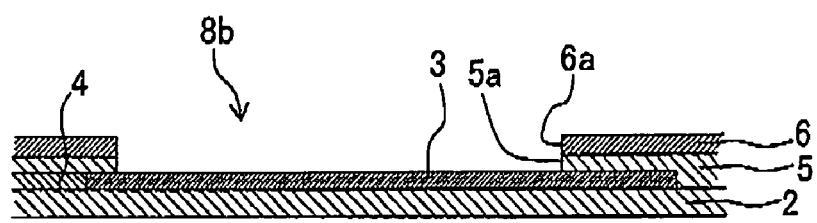
Figure 2C:
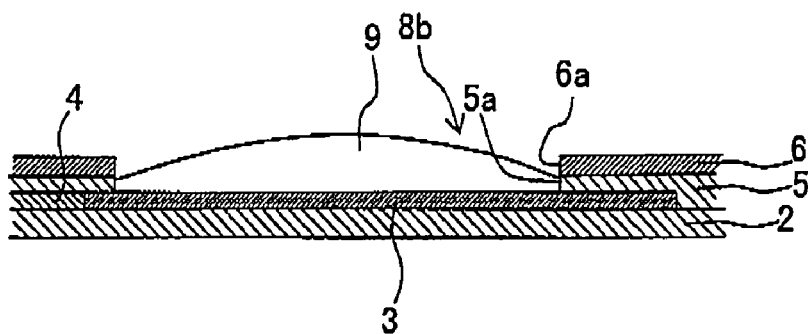
Figure 2D:
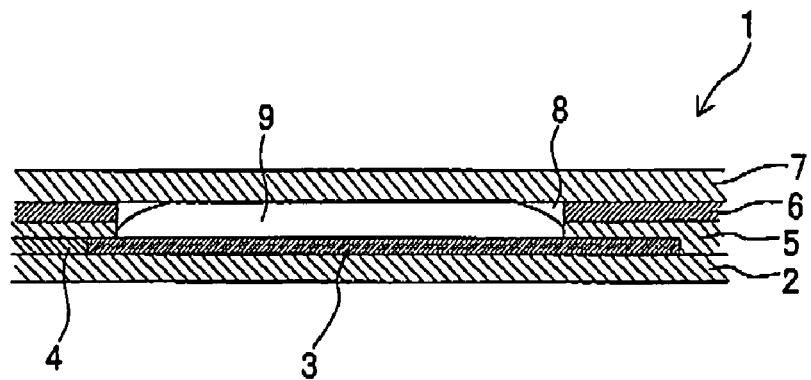

In the third step shown in FIG. 2C, the liquid electroconductive material 9 is injected into a recess 8b which is defined by the through holes 5a and 6a, and the power feeding electrode 3, and in the fourth step which is the last step, the protective sheet 7 is attached to the adhesive layer 6 (refer to FIG. 2D). Accordingly, an opening of the recess 8b (an opening of the through hole 6a in the adhesive layer 6) is closed by the protective sheet 7, thereby forming the first accommodating space 8, and the liquid electroconductive material 9 is enclosed in the first accommodating space 8.

In the wiring unit 1 formed in such manner, it is possible to connect easily the power feeding electrode 3 and an object electrically via the liquid electroconductive material 9 by peeling the protective layer 7 off from the wiring unit 1, and attaching to the object. Moreover, since it is connected via the liquid electroconductive material 9, even when the object is an object which is deformed, such as a piezoelectric layer 20 which will be described later, it is possible to secure the electrical connection. Moreover, since the liquid electroconductive material 9 is enclosed in the protective sheet 7, it is possible to prevent the liquid electroconductive material 9 from leaking out from the wiring unit 1. Further, since the first surplus space 8a is provided in the first accommodating space 8, it is possible to accommodate the expansion in the first surplus space 8a even when the liquid electroconductive material 9 is expanded thermally.

Next, a liquid jetting apparatus 10 in which the wiring unit 1 described above is used will be described by citing an example of an ink-jet printer.

FIG. 3 is a schematic perspective view showing the liquid jetting apparatus 10 according to the embodiment of the present invention. As shown in FIG. 3, the liquid jetting apparatus 10 which is an ink-jet printer has a guide rod 13 which is installed in a casing 12, and a carriage 14 is slidably supported by the guide rod 13, to slide along the guide rod 13.

A recording head 15 is provided at a lower side of the carriage 14, and an ink (a liquid) is jetted downward from the recording head 15.

A pulley 17 is arranged near both end portions of the guide rod 13, and a timing belt 18 is put around the two pulleys 17. An output shaft of a motor 19 which rotates in a normal and a reverse direction is connected to the one of the pulleys 7, and the timing belt 18 is turned in a normal direction and a reverse direction by a rotational drive of the motor 19. Moreover, the carriage 14 is connected to the timing belt 18, and with the rotation of the timing belt 18, the carriage 14 and the recording head 15 reciprocate in one direction and the other direction along the guide rod 13.

A portion below the recording head 15 is a transporting path of a recording paper 10a which is a recording medium. Paper transporting rollers 21 are installed in the casing 12 such that, a center of axis of rotation is parallel to the guide rod 13. The recording paper 10a is transported below the recording head 15 along the transporting path by the paper transporting rollers 21. With the recording head 15 positioned above the recording paper 10a, the recording head 15 is made to reciprocate while transporting the recording paper 10a intermittently, and by jetting the ink from the recording head 15 during the operation, it is possible to form a desired image by making the ink adhered at a predetermined position on the recording paper 10a.

In the following description, a 'scanning direction' means a direction in which the recording head 15 moves along the guide rod 13, and a 'transporting direction' means a direction in which the recording paper 10a is transported below the recording head 5. Other cases and other directions will be described when deemed appropriate.

Figure 4:
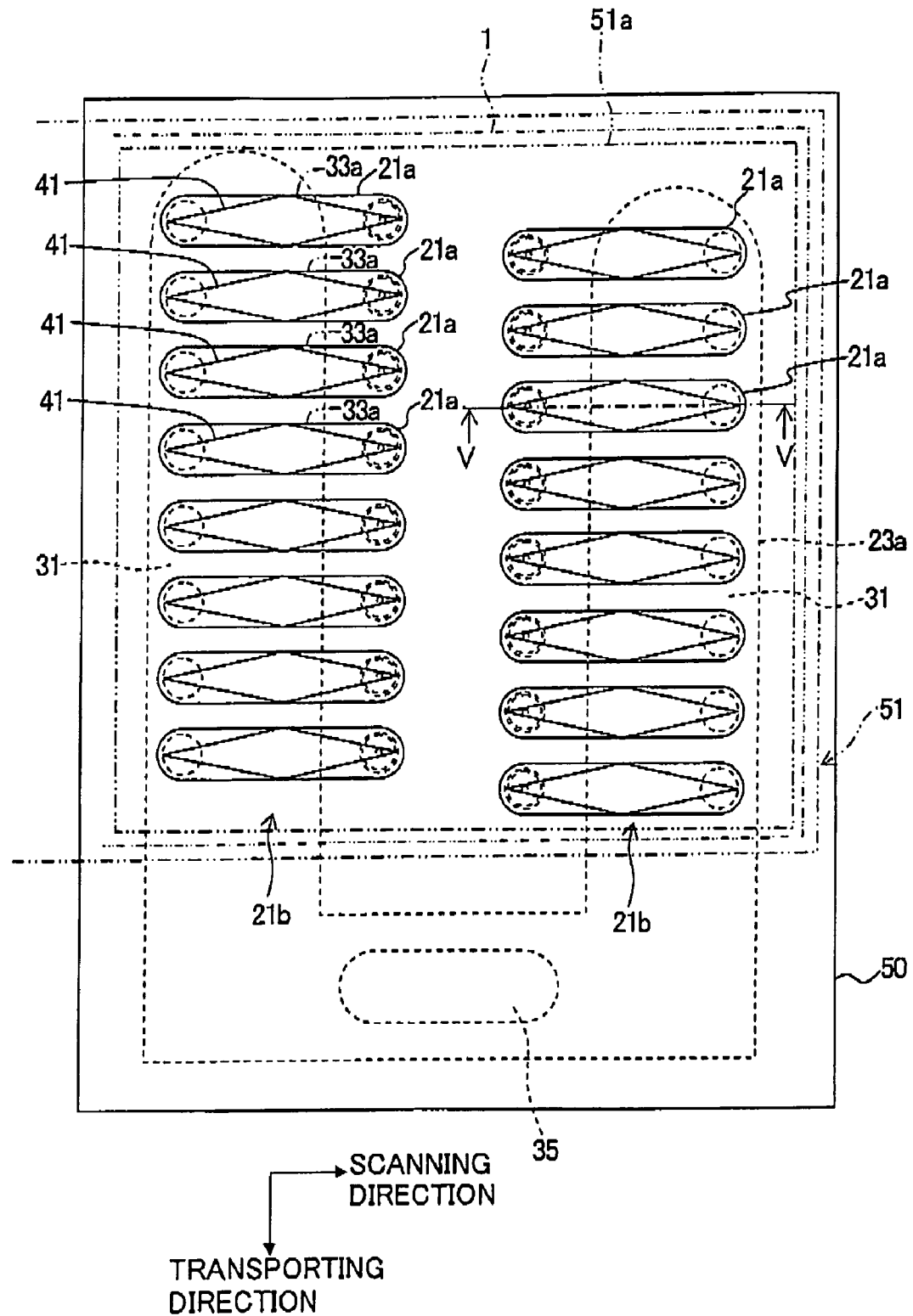
FIG. 4 is a schematic plan view showing a structure when a recording head is viewed from a top.
Figure 5:
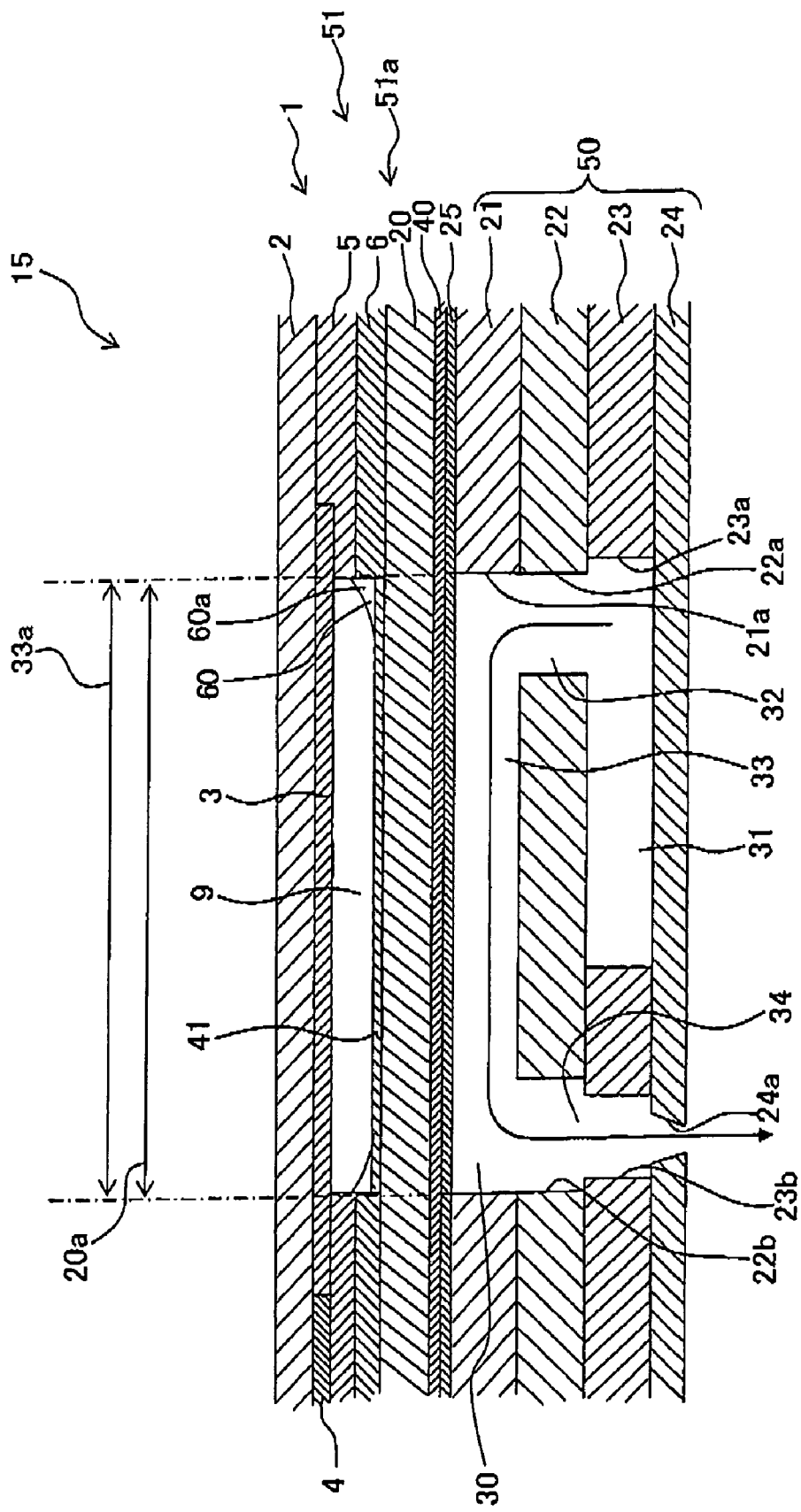
FIG. 5 is a schematic cross-sectional view showing a structure when the recording head shown in FIG. 4 is cut along a line V-V.

FIG. 4 is a schematic plan view when the recording head 15 is viewed from a top. FIG. 5 is a schematic cross-sectional view when the recording head 15 shown in FIG. 4 is cut along a line V-V. As shown in FIG. 4, the recording head 15 includes a channel unit 50 in which a liquid channel 30 (refer to FIG. 5) which will be described later is formed, and an actuator 51 which is connected to an upper surface of the channel unit 50. A plurality of pressure chamber holes 21a each having an elliptical shape extending in the scanning direction is formed at an upper portion of the channel unit 50. The pressure chamber holes 21a are arranged in the direction of transporting and form a pressure chamber hole row 21b, and a plurality of such pressure chamber hole rows 21b (two rows in FIG. 4) is arranged in the scanning direction adjacent to each other. Moreover, the actuator 51 has the wiring unit 1 described above, and a drive layer 51a which includes the piezoelectric layer 20 which will be described later and which is deformed by applying a voltage to the power feeding electrode 3 of the wiring unit 1 (refer to FIG. 5).

A structure of the recording head 15 will be described in further detail. Firstly, as shown in FIG. 5, the channel unit 50 of the recording head 15 has in order from a top, a pressure chamber plate 21, a connecting channel plate 22, a manifold plate 23, and a nozzle plate 24, which are stacked and adhered.

The pressure chamber hole 21a (also refer to FIG. 4) having an elliptical shape as described above, is formed in the pressure chamber plate 21. The connecting channel plate 22 is connected to a lower surface of the pressure chamber plate 21, and a liquid inflow hole 22a which communicates with one end of the pressure chamber hole 21a, and a first liquid outflow hole 22b which communicates with the other end of the pressure chamber hole 21a are formed in the connecting channel plate 22. The manifold plate 23 has a manifold hole 23a having a comparatively larger opening area, which extends in the transporting direction (also refer to FIG. 4), and the manifold hole 23a communicates with all the pressure chamber holes 21a which form one pressure chamber hole row 21b (refer to FIG. 4), via each liquid inflow hole 22a. Moreover, apart from the manifold hole 23a, a second liquid outflow hole 23b is formed in the manifold plate 23, and the second liquid outflow hole 23b communicates with the pressure chamber hole 21a via the first liquid outflow hole 22b. The nozzle plate 24 has a nozzle hole 24a (jetting port) which communicates with the pressure chamber hole 21a via the first liquid outflow hole 22b and the second liquid outflow hole 23b, and a diameter of an opening of the nozzle hole 24a is progressively narrowed downward.

By stacking and adhering the pressure chamber plate 21, the connecting channel plate 22, the manifold plate 23, and the nozzle plate 24 in such manner, the manifold hole 23a described above is closed from a lower side by a portion, of the nozzle plate 24, other than the nozzle hole 24a, and is closed partially from an upper side by a portion, of the connecting channel plate 22, other than the liquid inflow hole 22a and the first liquid outflow hole 22b. Accordingly, a common liquid chamber 31 is formed. Moreover, the pressure chamber hole 21a is closed from an upper side by a vibration plate 25 made of a metallic material which is stacked on and adhered to the pressure chamber plate 21, and is closed partially from a lower side by a portion, of the connecting channel plate 22, other than the liquid inflow hole 22a and the first liquid outflow hole 22b. Accordingly, a pressure chamber 33 is formed.

Furthermore, the liquid inflow hole 22a in the connecting channel plate 22 forms a liquid inflow channel 32 which communicates the common liquid chamber 31 and the pressure chamber 33. The first liquid outflow hole 22b and the second liquid outflow hole 23b in the connecting channel plate 22 and the manifold plate 23 communicate with each other, and form a liquid outflow channel 34 which communicate the pressure chamber 33 and the nozzle hole 24a. Moreover, a liquid channel 30 which is continuous, and through which the ink flows is formed by the common liquid chamber 31, the liquid inflow channel 32, the pressure chamber 33, the liquid outflow channel 34, and the nozzle hole 24a.

As shown in FIG. 4, the two common liquid chambers 31 provided corresponding to the two pressure chamber hole rows 21b communicate with each other, and these common liquid chambers 31 communicate with an ink tank (not shown in the diagram) which is provided separately from the recording head 15, via a through hole 35 which is formed in the pressure chamber plate 21 and the connecting channel plate 22. Consequently, the ink from the ink tank is supplied to the common liquid chamber 31 through the through hole 35, and is filled in the liquid channel 30 from the common liquid chamber 31 up to the nozzle hole 24a. When the vibration plate 25 which defines an upper wall of the pressure chamber 33 vibrates due to driving of the actuator 51, a volume of the pressure chamber 33 is changed, and a pressure is applied to the ink inside the pressure chamber 33. Accordingly, the ink is transported to a downstream side of the liquid channel 30, and is jetted to an outside from (through) the nozzle hole 24a.

Next, the actuator 51 will be described below. As shown in FIG. 4, the actuator 51 includes the wiring unit 1 which forms an upper layer, and the drive layer 51a which forms a lower layer. Out of the two, the drive layer 51 has the piezoelectric layer 20, and a common electrode 40 and a drive electrode 41 which sandwich the piezoelectric layer 20.

The drive layer 51a will be described below in detail. The common electrode 40 is stacked on an upper surface (a surface not facing the channel unit 50) of the vibration plate 25, and the piezoelectric layer 20 is stacked on an upper surface of the common electrode 40. The piezoelectric layer 20 is formed of a piezoelectric material which is principally composed of lead zirconium titanate (PZT) which is a solid solution of lead titanate and lead zirconate, and which is a ferroelectric substance. The piezoelectric layer 20 is formed as a layer to cover the plurality of pressure chambers 33 on the upper surface of the common electrode 40. As a method for forming the piezoelectric layer 20, a known film forming technology may be used, and it is possible to use an AD (aerosol deposition) method, in which fine particles of a submicron size are mixed with a gas to form an aerosol, and are sprayed through a nozzle. A non electroconductive layer of a material such as alumina is formed as a film on an upper surface of the vibration plate 25, and since the common electrode 40 is arranged on an upper surface of the non electroconductive layer, the vibration plate 25 and the common electrode 40 are mutually insulated electrically The drive electrode 41 is arranged on the upper surface of the piezoelectric layer 20, and it is possible to form the drive electrode 41 by screen printing an electroconductive paste such as silver-palladium paste. The drive electrode 41 is provided in an area occupied by the pressure chamber 33 when viewed from a direction of thickness (in other words, a plan view) of the piezoelectric layer 20, in other words, to overlap with a pressure chamber area 33a (refer to FIG. 4 and FIG. 5). Moreover, as shown in FIG. 4, the drive electrode 41 according to the embodiment, is formed to be rhombus shaped having diagonals of substantially same dimensions as a length and a breadth of the pressure chamber area 33a having an elliptical shape, and is arranged not to stick out from the pressure chamber area 33a (is arranged to be accommodated entirely in the pressure chamber area 33a). Since the pressure chamber area 33a is an area occupied by the pressure chamber 33 in a plan view as mentioned above, it is preferable that a portion of the piezoelectric layer 20 overlapping with the pressure chamber area 33a forms an active area which is substantially deformable by applying an electric voltage, when the ink is jetted from the nozzle hole 24a.

On the other hand, the wiring unit 1 which forms the upper layer of the actuator 51 includes the substrate 2 made of polyimide, the wire 4 and the power feeding electrode 3 arranged on the one surface 2a of the substrate 2, the insulating layer 5, and the adhesive layer 6 as described above referring to FIG. 1. The adhesive layer 6 is stacked on and adhered to the piezoelectric layer 20 such that the power feeding electrode 3 faces a portion overlapping with the pressure chamber area 33a of the piezoelectric layer 20, through the through holes 5a and 6a in the insulating layer 5 and the adhesive layer 6. In this manner, the wiring unit 1 is connected to the drive layer 51 and the actuator 51 is formed. As a result, in the actuator 51, the power feeding electrode 3 is arranged to face the drive electrode 41.

A second accommodating space 60 which is a liquid-tight space is formed by the through holes 5a and 6a, the power feeding electrode 3, and the piezoelectric layer 20 (or the drive electrode 41), in a state that the wiring unit 1 and the drive layer 51a are connected with each other. The liquid electroconductive material 9 in the first accommodating space 8 of the wiring unit 1 is enclosed in the second accommodating space 60. The second accommodating space 60 has a surplus volume other than a volume occupied by the liquid electroconductive material 9 (first space), and this surplus volume forms a second surplus space (second space) 60a in which the liquid electroconductive material 9 is not accommodated.

Next, a method for producing the abovementioned liquid jetting apparatus 10 will be described below. FIG. 6A to FIG. 6D are diagrams showing a method for producing the recording head 15 in the liquid jetting apparatus 10, and show steps from a first step to a fourth step in the method for producing, respectively. The method for producing the recording head 15 in the liquid jetting apparatus 10 is described below, and since it is possible to use known methods of producing for the other components of the liquid jetting apparatus 10, the description thereof is omitted.

Figure 6A:
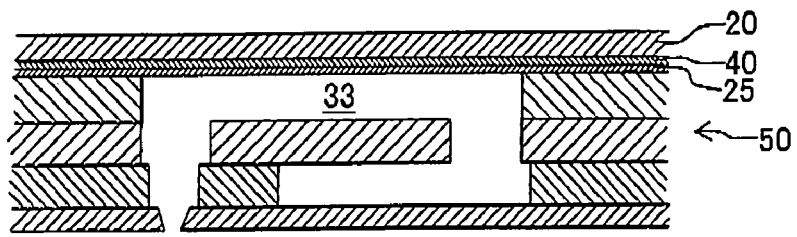
FIG. 6A to FIG. 6D are diagrams showing a producing method of the recording head in the liquid jetting apparatus shown in FIG. 3, and show steps from a first step to a fourth step respectively.

In the first step as shown in FIG. 6A, the common electrode 40 is stacked on the upper surface of the vibration plate 25 provided on the upper portion of the channel unit 50, and the piezoelectric layer 20 is stacked on the upper surface of the common electrode 40. In the second step, the drive electrode 41 is arranged on an upper surface of the piezoelectric layer 20 (refer to FIG. 6B). Accordingly, the common electrode 40 is joined to a lower surface (surface facing the pressure chamber 33) of the piezoelectric layer 20, and the drive electrode 41 is joined to the upper surface of the piezoelectric layer 20, and the drive layer 51a is formed. Moreover, at the time of forming the drive electrode 41 on the piezoelectric layer 20, the drive electrode 41 is formed corresponding to a position of the pressure chamber 33, or more precisely, is formed to overlap with the pressure chamber area 33a.

Figure 6B:
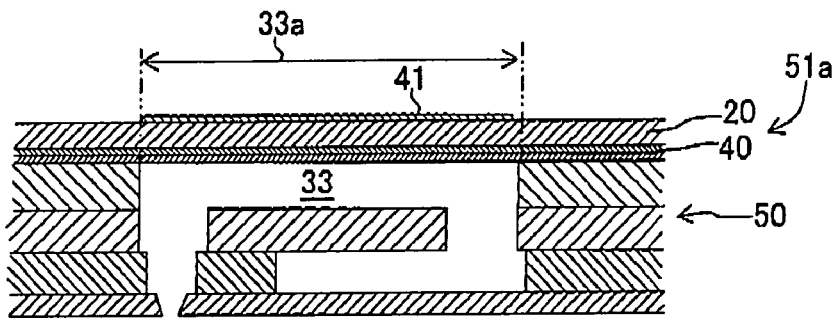
Figure 6C:
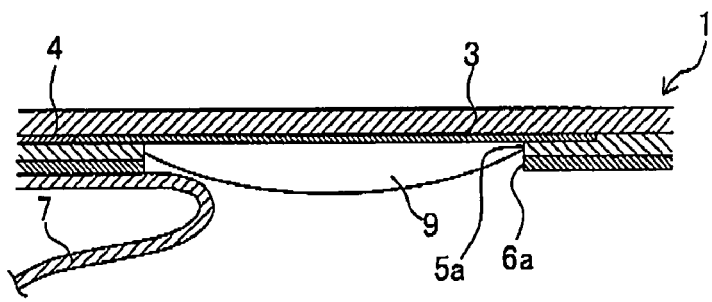
Figure 6D:
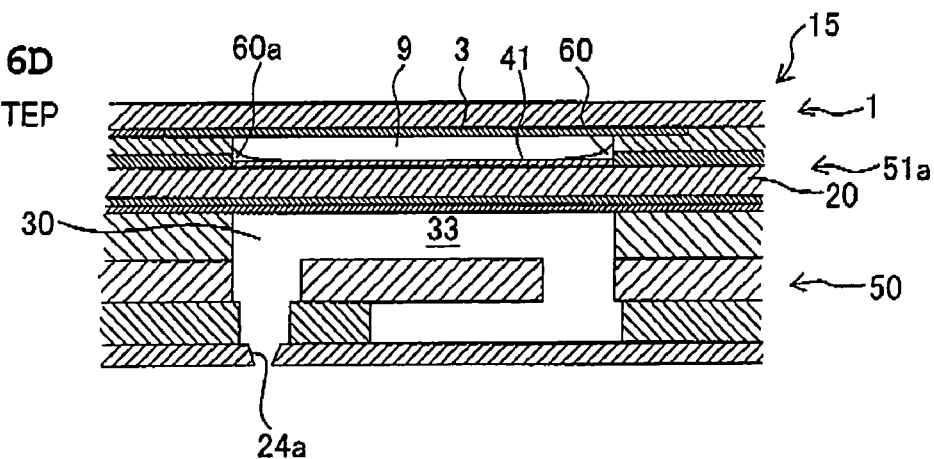

In the third step shown in FIG. 6C, the protective sheet 7 is peeled off from the wiring unit 1 shown in FIG. 1. In the fourth step shown in FIG. 6D, which is the last step, the wiring unit 1 from which the protective sheet 7 has peeled off is stacked on and adhered to the drive layer 51a formed in the second step. In the fourth step, the wiring unit 1 is adhered to the drive layer 51a such that the power feeding electrode 3 faces a portion of the piezoelectric layer 20, corresponding to the pressure chamber area 33a, through the through holes 5a and 6a (refer to FIG. 6C). It is more preferable to form an opening of the through holes 5a and 6a to be same as or larger than the pressure chamber area 33a such that the entire pressure chamber area 33a is positioned within the through holes 5a and 6a, and to adhere the wiring unit 1 and the drive layer 51a.

By completing the fourth step, the second accommodating space 60 in which the liquid electroconductive material 9 is enclosed is formed by the through holes 5a and 6a, the power feeding electrode 3, and the piezoelectric layer 20 (or the drive electrode 41), and the power feeding electrode 3 and the drive electrode 41 are connected electrically via the liquid electroconductive material 9. Since the drive electrode 41 is formed to correspond to a position of the pressure chamber 33, a contact area 20a of the piezoelectric layer 20 and the liquid electroconductive material 9 (same as a contact area of the drive electrode 41 and the piezoelectric layer 20 in the embodiment) is positioned inside the pressure chamber area 33a (refer to FIG. 5). Since the first surplus space 8a other than the volume of the liquid electroconductive material 9 is included in the first accommodating space 8 of the wiring unit 1, the second surplus space 60 apart from the volume of the liquid electroconductive material 9 is formed also in the second accommodating space 60 which is formed by adhering the wiring unit 1 to the drive layer 51a.

In the recording head 15 formed in such manner, when a voltage is applied to the power feeding electrode 3 via the wire 4, an electric potential difference is developed between the drive electrode 41 connected to the power feeding electrode 3 via the liquid electroconductive material 9 and the common electrode 40. Accordingly, an electric field is generated between the drive electrode 41 and the common electrode 40, and the piezoelectric layer 20 sandwiched between the drive electrode 41 and the common electrode 40 is deformed, and the vibration plate 25 is also deformed. As a result, a volume of the pressure chamber 33 is changed and the ink inside the pressure chamber 33 is jetted to an outside from the nozzle hole 24a via the liquid channel 30.

According to the liquid jetting apparatus 10 described above, it is possible to connect easily the power feeding electrode 3 and the drive electrode 41 via the liquid electroconductive material 9 by using the wiring unit 1. Moreover, since the power feeding electrode 3 and the drive electrode 41 are electrically connected via the liquid electroconductive material 9, even when the liquid electroconductive material 9 is made in a direct contact with a portion (an active portion) of the piezoelectric layer 20 corresponding to the pressure chamber area 33a, and which is deformed by the voltage applied, a deformation of this portion (active portion) of the piezoelectric layer 20 is not hindered.

Since it is possible to provide the contact area 20a within the pressure chamber area 33a, it is possible to integrate highly the pressure chambers 33. Accordingly, it is possible to make small the recording head 15, and to facilitate an improvement in a resolution of an image formed by the liquid jetted. Moreover, since the piezoelectric layer 20 and the liquid electroconductive material 9 are connected via the drive electrode 41, by using an electrode having a comparatively smooth surface as the drive electrode 41, it is possible to secure substantially a contact area between the drive electrode 41 and the liquid electroconductive material 9. As a result, it is possible to connect the piezoelectric layer 20 and the liquid electroconductive material 9 in a low resistance.

Furthermore, the second surplus space 60a in addition to the liquid electroconductive material 9 is formed in the second accommodating space 60 of the actuator 51. Consequently, even when the liquid electroconductive material 9 expands due to a heat generated at the time of driving the recording head 15, it is possible to accommodate the expanded volume in the second surplus space 60a, and to prevent the liquid electroconductive material 9 from leaking out from the second accommodating space 60a.

It is possible to use the wiring unit 1 by attaching to any object other than the liquid jetting apparatus 10 described above, and to connect electrically the object to which the wiring unit 1 is adhered and the power feeding electrode 3 via the liquid electroconductive material 9.

Figure 7:
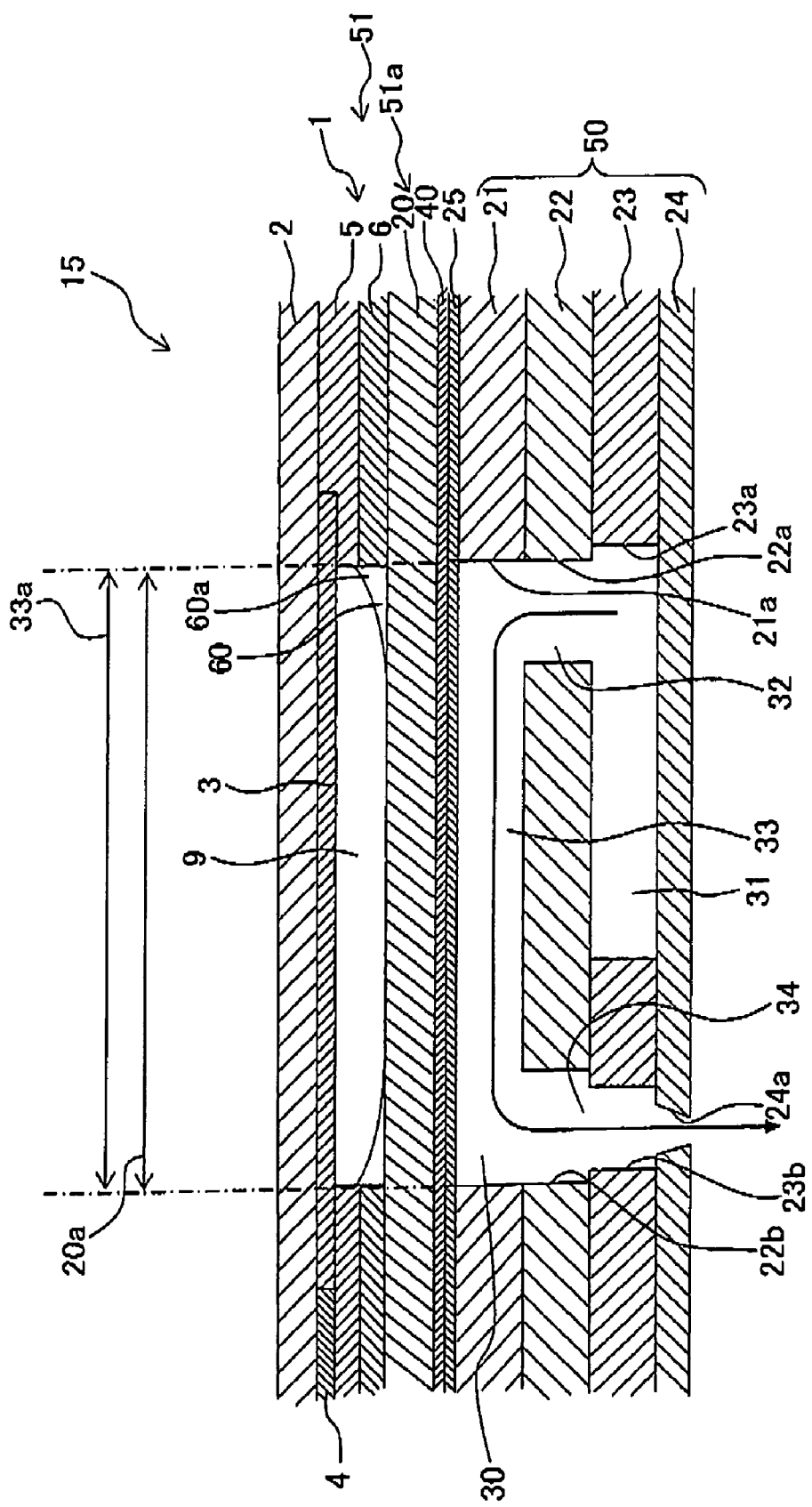
FIG. 7 is a cross-sectional view of a recording head according to another embodiment.

FIG. 7 is a cross-sectional view showing a recording head 70 according to another embodiment. In this recording head 70, the drive electrode 41 is not provided on the upper surface of the piezoelectric layer 20, and the liquid electroconductive material 9 of the wiring unit 1 is connected directly to the upper surface of the piezoelectric layer 20. In this case also, the contact area 20a between the liquid electroconductive material 9 and the piezoelectric layer 20 is positioned within the pressure chamber area 33a. The rest of the structure of the recording head 70 being similar to the structure of the corresponding portion in the recording head 15 which has already been described, the same reference numerals are assigned to corresponding components, and the description of such components is omitted.

Moreover, regarding a method for producing such recording head 70, the second step (step of arranging the drive electrode 41) in the method for producing the recording head 15 shown in FIG. 6B which has already been described is omitted, and the producing method is similar as the method for producing the recording head 15 by the first step, and the steps form the third step and the fourth step. Consequently, for the description of the method for producing the recording head 70, the description made by using FIG. 6A to FIG. 6D is to be referred to, and the description in detail is omitted here.

Even in the recording head 70, it is possible to connect easily the power feeding electrode 3 and the piezoelectric layer 20 by using the wiring unit 1, similarly as in the recording head 15 which has already been described. Moreover, it is possible to realize a high integration of the pressure chamber 33, and a compactness of the recording head 70 without hindering a deformation of the piezoelectric layer 20 due to the voltage applied to the portion (active portion) corresponding to the pressure chamber area 33a of the piezoelectric layer 20. Further, since the drive electrode 41 is not provided, the number of components and the number of producing steps are reduced, and it is possible to facilitate a reduction in cost.

Incidentally, as the liquid electroconductive material 9 in the wiring unit 1 described above, it is possible to use known materials having predetermined fluidity and predetermined electroconductivity at the time of using the wiring unit 1 by adhering to an object (such as the drive layer 51a described above).

For instance, it is possible to use an electroconductive adhesive which is used for supporting a quartz vibrator (crystal resonator), as the liquid electroconductive material 9. The electroconductive adhesive is high-viscosity liquid at temperature in which the liquid jetting apparatus 10 is used. In such electroconductive adhesive, a material such as an epoxy resin, a polyimide resin, or from a point of view of securing the fluidity, a silicon resin is more preferably used as a base material (also called as a binder) and an electroconductive filler made of a powder of a metal such as gold, silver, copper, nickel, aluminum, carbon, and graphite is kneaded with the base material. As a commercially available product, a product from among 3300 series manufactured by ThreeBond Co., Ltd., a product in the form of a liquid, and a product from a DOTITE SERIES of Fujikura Chemical Industry Co., Ltd. may be used.

Moreover, it is also possible to use an ionic liquid having a low melting point. A vapor pressure of the ionic liquid is almost zero, and the ionic liquid is fire resistant, and has a low viscosity and a high electroconductivity. Compounds such as imidazolium compounds, pyridium compounds, and aliphatic. compounds are available as an ionic liquid. As imidazolium ionic liquids, AEImBr, AEImBF4, AEImTFSI, ABImBr, ABImBF4, ABImTFSI, AAImBr, AAImBF4, and AAImTFSI (precisely, 1-aryl-3-alkylimidazolium compounds) manufactured by Kanto Kagaku Co., Ltd. are commercially available products. Moreover, as aliphatic ionic liquids, TMPA TFSI, PP13 TFSI, P13 TFSI, and P14 TFSI etc. manufactured by Kanto Kagaku Co., Ltd. are available.

Apart from this, known electroconductive polymers (such as Baytron PEDOT manufactured by TA Chemical Co.) and galinstan which is a liquid metal at a room temperature may be used.

It may be decided appropriately which material is to be used as the liquid electroconductive material 9, upon taking into consideration factors such as a volume resistivity ($\Omega$cm) of each material and a contact resistance (m$\Omega$) of the drive electrode 41 and the power feeding electrode 3 which are in contact with the liquid electroconductive material 9, in addition to a fluidity (in other words, a curing property) in a temperature range of the wiring unit 1 when the liquid jetting apparatus 10 is being used.

Figure 8:
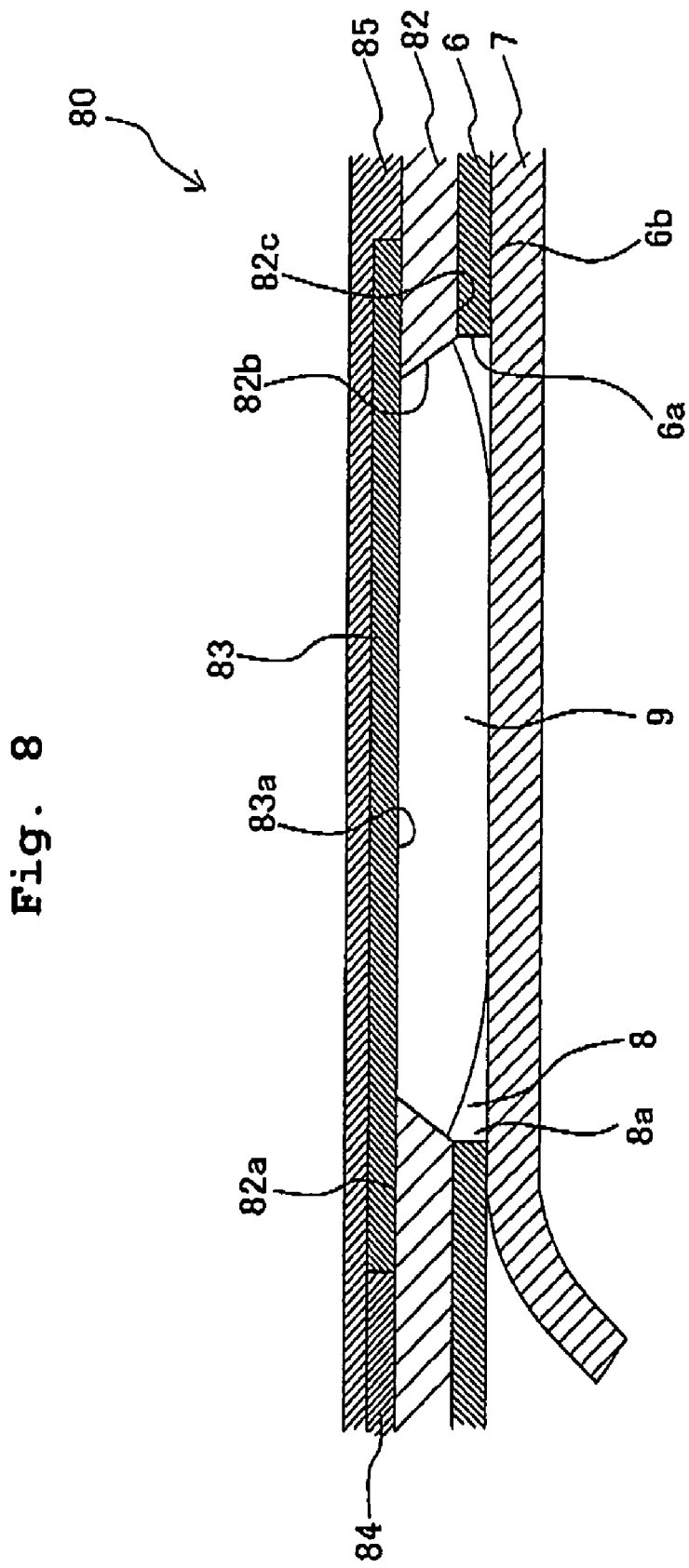
FIG. 8 is a cross-sectional view of a wiring unit according to another embodiment.

FIG. 8 is a cross-sectional view showing a wiring unit 80 according to another embodiment. The wiring unit 80 shown in FIG. 8 has a structure in which, the substrate 2 and the insulating layer 5 in the wiring unit 1 shown in FIG. 1 are interchanged. More elaborately, the wiring unit 80 includes a substrate (a second insulating layer) 82 in the form of a plate (or a sheet form) which is formed of an insulating material such as polyimide, and a wire 84 and a power feeding electrode 83 made of a copper foil are arranged on one surface (upper surface in FIG. 8) 82a of the substrate 82. The wire 84 electrically connects the power feeding electrode 83 and an external power supply which is not shown in the diagram, and an electric power from an external power supply is supplied to the power feeding electrode 83.

An insulating layer (a first insulating layer) 85 formed of a material such as solder resist is provided on the one surface 82a of the substrate 82, and the power feeding electrode 83 and the wire 84 are covered by this insulating layer 85. Moreover, a through hole 82b which is formed by a method such as a laser machining and an etching in the substrate 82, and the power feeding electrode 83 is exposed in this through hole 82b. In FIG. 8, a portion 83a of the power feeding electrode 83 is exposed in the through hole 82b. However, the entire power feeding electrode 83 may be exposed in the through hole 82b.

The adhesive layer 6 is provided on the other surface 82c of the substrate 82. The adhesive layer 6 has the through hole 6a, a shape of which is matched with a shape of the through hole 82b in the substrate 82, and the adhesive layer 6 is adhered to the substrate 82 such that the power feeding electrode 83 is exposed in the through holes 82a and 6a. Furthermore, the protective sheet 7 which is detachable is adhered to a surface 6b, of the adhesive layer 6, not facing the substrate 82. The first accommodating space 8 which is a liquid-tight space is defined by the through holes 82a and 6a, the power feeding electrode 83, and the protective sheet 7, and the liquid electroconductive material 9 is enclosed in this first accommodating space 8. Moreover, the first accommodating space 8 has a surplus space in addition to the volume occupied by the liquid electroconductive material 9, and this surplus space forms the first surplus space 8a.

A producing process of the wiring unit 80 is as follows. Firstly, the power feeding electrode 83 and the wire 84 are formed on the one surface 82a of the substrate 82 by screen printing. At this time, the power feeding electrode 83 is formed to be positioned such that the power feeding electrode 83 is to be exposed in the through hole 82b. After that, the through hole 82b is formed in the substrate 82 from a side of the other surface 82c by wet etching treatment, or the like. Next, the insulating layer (first insulating layer) 85 is formed on the one surface 82a of the substrate 82 by a method such as the photolithography and the screen printing, such that the power feeding electrode 83 and the wire 84 are entirely covered by the insulating layer 85. Thereafter, the adhesive layer 6 having the through hole 6a is formed on the other surface 82c of the substrate 82. Accordingly, a stacked body in which the insulating layer (first insulating layer) 85, the power feeding electrode 83 and the wire 84, the substrate (second insulating layer) 82, and the adhesive layer 6 are stacked in this order is formed, and the power feeding electrode 83 is exposed in the through holes 82b and 6a formed in the substrate 82 and the adhesive layer 6 respectively. Further, the liquid electroconductive material 9 is filled in a recess which is defined by the through holes 82b and 6a, and the power feeding electrode 83, and by adhering the protective layer 7 to the adhesive layer 6, the producing of the wiring unit 80 is completed.

Even in the wiring unit 80 having such structure, it is possible to connect easily the power feeding electrode 83 and an object electrically by peeling the protective layer 7 off from the wiring unit 80 and adhering to the object, similarly as in the wiring unit 1 shown in FIG. 1. Moreover, since the object is connected to the power feeding electrode 83 via the liquid electroconductive material 9, even when the object is deformed as the piezoelectric layer 20 (refer to FIG. 5), it is possible to secure the electrical connection. Furthermore, since the liquid electroconductive material 9 is enclosed by the protective sheet 7 in the wiring unit 80, it is possible to prevent the liquid electroconductive material 9 from leaking out from the wiring unit 80. Moreover, since the first surplus space 8a is provided in the first accommodating space 8, even when the liquid electroconductive material 9 is expanded due to heat, it is possible to absorb the expanded portion in the first surplus space 8a. Furthermore, it is also possible to use the wiring unit 80 in the liquid jetting apparatus 10 which has already been described, and in this case, it is possible to show an action and an effect same as in a case when the wiring unit 1 is used.

In the embodiments described above, the description has been made by citing examples of specific shapes of the power feeding electrode, the through hole, and the pressure chambers, and specific materials of substrate layer and the insulating layer to be used in the wiring unit. However, the present invention is not restricted to the shapes and the materials described above, and it is possible to use any shapes and materials, provided that an effect of the present invention is achieved.

An example in which, the wiring unit for connecting electrically the power feeding electrode and an object is applied to an ink-jet printer as a liquid jetting apparatus has been described above. However, the present invention is applicable not only to the field described above, but also to various electronic apparatuses, in which it is necessary to connect electrically a power feeding electrode provided to a wiring unit, and an object which is deformable.

What is claimed is:

1. A wiring unit comprising:
   a first insulating layer which is provided with an electrode and a wire electrically connected to the electrode on one surface of the first insulating layer;
   a second insulating layer which is formed on the one surface of the first insulating layer and which covers the wire;
   an adhesive layer which is formed on a surface, of the second insulating layer, not facing the first insulating layer;
   a through hole which is formed through the adhesive layer and the second insulating layer and in which the electrode is exposed;
   a protective sheet which is detachably adhered on a surface, of the adhesive layer, not facing the second insulating layer, to cover the through hole; and
   a liquid electroconductive material which is filled in a space defined by the through hole, the electrode exposed in the through hole, and the protective sheet.

2. The wiring unit according to claim 1, wherein the space has a first space in which the liquid electroconductive material is accommodated and a second space in which the liquid electroconductive material is not accommodated.

3. The wiring unit according to claim 1, wherein the second insulating layer and the adhesive layer are formed integrally by an insulating sheet having an adhesive surface.

4. The wiring unit according to claim 1, wherein a portion of the electrode is exposed in the through hole.

5. The wiring unit according to claim 1, wherein the first insulating layer is formed of polyimide, and the second insulating layer is formed of solder resist.

6. The wiring unit according to claim 1, wherein the first insulating layer is formed of solder resist, and the second insulating layer is formed of polyimide.

7. A method for producing a wiring unit, comprising:
   forming a stacked body which has a first insulating layer having an electrode and a wire electrically connected to the electrode on one surface of the first insulating layer, a second insulating layer stacked on the one surface of the first insulating layer, an adhesive layer formed on a surface, of the second insulating layer, not facing the first insulating layer, a through hole formed through the adhesive layer and the second insulating layer and in which the electrode is exposed;
   injecting a liquid electroconductive material into a recess defined by the through hole and the electrode exposed in the through hole; and
   attaching a detachable protective sheet on the adhesive layer so that the protective sheet covers the through hole to enclose the liquid electroconductive material in the wiring unit.

8. The method for producing the wiring unit according to claim 7, wherein a space defined by the recess and the protective sheet has a first space in which the liquid electroconductive material is accommodated and a second space in which the liquid electroconductive material is not accommodated.

9. A liquid jetting apparatus comprising:
   a jetting port through which a liquid is jetted;
   a liquid channel which is connected to the jetting port, and through which the liquid to be jetted from the jetting port flows;
   a pressure chamber which is formed in the liquid channel;
   a piezoelectric layer which covers the pressure chamber and which is deformed to change a volume of the pressure chamber when a voltage is applied to the piezoelectric layer; and
   a wiring unit having an electrode which is electrically connected to the piezoelectric layer and which applies the voltage,
   wherein the wiring unit includes a first insulating layer provided with an electrode and a wire electrically connected to the electrode on one surface of the first insulating layer, a second insulating layer which is formed on the one surface of the first insulating layer and which covers the wire, an adhesive layer which is formed on a surface of the second insulating layer not facing the first insulating layer, a through hole which is formed through the adhesive layer and the second insulating layer and in which the electrode is exposed;
   a liquid electroconductive material is accommodated in a recess which is defined by the through hole and the electrode exposed in the through hole; and
   the wiring unit is connected via the adhesive layer to a surface of the piezoelectric layer not facing the pressure chamber, and the electrode and the piezoelectric layer are electrically connected to each other via the liquid electroconductive material.

10. The liquid jetting apparatus according to claim 9, wherein a drive electrode is formed on the surface of the piezoelectric layer not facing the pressure chamber, at a position corresponding to the pressure chamber; and
    the electrode of the wiring unit is electrically connected to the surface of the piezoelectric layer, not facing the pressure chamber, via the liquid electroconductive material and the drive electrode.

11. The liquid jetting apparatus according to claim 10, wherein the drive electrode is formed in an area, of the piezoelectric layer, corresponding to the pressure chamber.

12. The liquid jetting apparatus according to claim 9, wherein a space defined by the recess and the surface of the piezoelectric layer not facing the pressure chamber has a first space in which the liquid electroconductive material is accommodated and a second space in which the liquid electroconductive material is not accommodated.

13. The liquid jetting apparatus according to claim 9, wherein an area at which the piezoelectric layer and the electroconductive material make contact with each other is included in an area of the piezoelectric layer corresponding to the pressure chamber.

14. A method for producing a liquid jetting apparatus having a jetting port which jets a liquid, a liquid channel which is connected to the jetting port and through which the liquid to be jetted from the jetting port flows, and a pressure chamber which is formed in the liquid channel, the method comprising:

providing a piezoelectric layer, which is deformed when a voltage is applied to the piezoelectric layer, such that one surface of the piezoelectric layer faces the pressure chamber;

providing a wiring unit including a first insulating layer which is provided with an electrode and a wire electrically connected to the electrode on one surface of the first insulating layer, a second insulating layer which is formed on the one surface of the first insulating layer and which covers the wire, an adhesive layer which is formed on a surface of the second insulating layer not facing the first insulating layer, a through hole which is formed through the adhesive layer and the second insulating layer and in which the electrode is exposed, and a protective sheet which is detachably adhered on a surface of the adhesive layer not facing the second insulating layer, a liquid electroconductive material being filled in a space defined by the through hole, and the electrode being exposed in the through hole, and the protective sheet;

peeling the protective sheet off from the wiring unit; and attaching the channel unit, from which the protective sheet has been peeled off, to the other surface of the piezoelectric layer via the adhesive layer such that an area of the piezoelectric layer corresponding to the pressure chamber and the through hole of the wiring unit are overlapped with each other in a thickness direction of the piezoelectric layer to electrically connect the electrode and the piezoelectric layer via the liquid electroconductive material.

15. The method for producing the liquid jetting apparatus according to claim 14, further comprising forming a drive electrode on the other surface of the piezoelectric layer at a position corresponding to the pressure chamber.

* * * * *